United States Patent [19]

Ishikawa et al.

[11] Patent Number: 4,546,479
[45] Date of Patent: Oct. 8, 1985

[54] SEMICONDUCTOR LIGHT-EMITTING DEVICE WITH LAYERS HAVING DIFFERENT BAND GAPS

[75] Inventors: Hiroshi Ishikawa, Tokyo; Mitsuhiro Yano, Kawasaki, both of Japan

[73] Assignee: Fujitsu Limited, Kawasaki, Japan

[21] Appl. No.: 435,741

[22] Filed: Oct. 21, 1982

[30] Foreign Application Priority Data

Oct. 27, 1981 [JP] Japan ................... 56-171801

[51] Int. Cl.$^4$ ............................................. H01S 3/19
[52] U.S. Cl. ...................... 372/45; 357/17; 372/46
[58] Field of Search ............... 372/44, 45, 46; 357/17, 357/16

[56] References Cited

U.S. PATENT DOCUMENTS

| 3,812,516 | 5/1974 | Hayashi | 372/45 |
| 3,838,359 | 9/1974 | Hakki et al. | 372/46 |
| 4,016,505 | 4/1977 | Itoh et al. | 372/45 |
| 4,184,170 | 1/1980 | Burnham et al. | 372/45 |
| 4,287,485 | 9/1981 | Hsieh | 372/45 |

OTHER PUBLICATIONS

Applied Physics Letters, "A New Current-Injection Heterostructure Laser: The Double-Barrier Double-Heterostructure Laser", by Tsang, vol. 38, No. 11, 6/81.

Electronics Letters, "High Temperature CW Operation of 1.5 mum InGaAsP/InP Buffer-Layer Loaded Planoconvex Waveguide Lasers," vol. 17, No. 6, 3/19/81.

IEEE Electron Device Letters, "Performance Characteristics and Extended Lifetime Data for InGaAsP/InP LED's", by Yeats et al., vol. EDL-2, No. 9, 9/81, pp. 234-236.

Electronics Letters, "Temperature Dependence of InGaAsP Double-Heterostructure Laser Characteristics", by Nahory et al., vol. 15, No. 21, 10/79, pp. 695-696.

Primary Examiner—James W. Davie
Attorney, Agent, or Firm—Staas & Halsey

[57] ABSTRACT

A semiconductor light-emitting device fabricated as a double hetero-structure InGaAsP/InP-type laser. The laser includes a buffer layer made of a semiconductor. The buffer layer is located at the upper edge of the flow region of electrons as seen from the active layer. The conductivity type of the buffer layer is opposite to that of a clad layer located at the upper edge of the flow region of electrons seen from the buffer layer. A, the band gap of the buffer layer is wider than that of the active layer but narrower than that of a clad layer adjacent to the buffer layer. The thickness of the buffer layer does not exceed the diffusion length of the electrons injected into the buffer layer.

6 Claims, 8 Drawing Figures

SEMICONDUCTOR LIGHT-EMITTING DEVICE WITH LAYERS HAVING DIFFERENT BAND GAPS

BACKGROUND OF THE INVENTION

1. Field of the Invention

The present invention relates to a semiconductor light-emitting device.

2. Description of the Prior Art

Generally, a semiconductor light-emitting device, such as a double hetero-structure laser or a light-emitting diode comprised of GaAlAs, is readily available for commercial use. However, in recent years, a semiconductor light-emitting device, such as a double hetero-structure laser or a light-emitting diode comprised of InGaAsP/InP, has also been readily available for commercial use, especially in the field of light communications systems. In InGaAsP/InP-type semiconductor light-emitting devices (lasers), a light having a wavelength in the range of 1–1.6 μm is emitted. This light is suitable for light communications systems in view of the transmission loss along an optical fiber used in the device, as compared with a light emitted from the widely used GaAlAs-type laser having a wavelength of 0.85 μm.

Although the InGaAsP/InP-type laser is preferable for a light communications system, it has a defect in respect to the so-called lasing threshold level-temperature characteristic. In general, the lasing threshold level must be relatively constant with respect to a wide range of ambient temperatures. In this regard, the InGaAsP/InP-type laser does not have a good characteristic, that is, the lasing threshold level sharply increases with an increase of temperature, especially when the temperature is over about 70° C.

The reason for the above-mentioned defect resides briefly in a so-called "carrier leakage", that is, carriers go over a hetero-barrier and away therefrom, since the electron energy level is distributed in an active layer at a higher level with an increase of temperature. Therefore, some of the electrons having a sufficient energy level to go over the hetero-barrier leak into a clad layer. In such a case, it is considered that such a wide variation of the lasing threshold level with respect to the temperature may be enhanced by a relatively long energy relaxation time of electrons in an active layer and also by the Auger process in which an electron attains high energy through non-radiative recombination of neighbouring electrons. These mechanisms increase the number of electrons having a sufficient energy to go over the hetero-barrier.

SUMMARY OF THE INVENTION

It is an object of the present invention to overcome the above-mentioned defect of the InGaAsP/InP-type double hetero-structure laser.

The above object is attained by a semiconductor buffer layer sandwiched between the active layer and the clad layer. In accordance with the present invention, there is provided a light-emitting device fabricated as a double hetero-structure InGaAsP/InP type laser. The laser includes a buffer layer made of a semiconductor and located at an upper edge of a flow region of electrons. A band gap of the buffer layer is wider than that of an active layer but narrower than that of a clad layer, both formed adjacent to the buffer layer. The thickness of the buffer layer does not exceed the diffusion length of the electrons injected into the buffer layer.

DESCRIPTION OF THE PREFERRED EMBODIMENTS

Figure 1A:
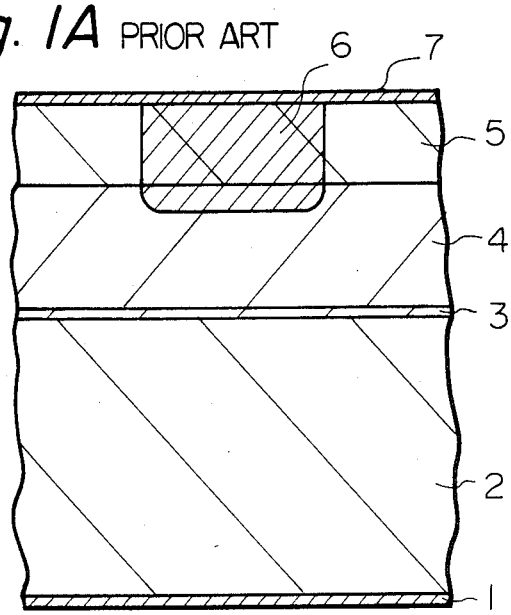
FIG. 1A is a cross-sectional view of a conventional semiconductor laser.

FIG. 1A is a cross-sectional view of a conventional semiconductor laser. In FIG. 1A, reference numeral 1 represents an electrode made of an alloy of, for example, AuGeNi. On the electrode 1, an n type InP substrate (first clad layer) 2 is formed. On the clad layer 2, a p type InGaAsP (active layer) 3 is formed. On the active layer 3, a p type InP (second clad layer) 4 is formed. On the clad layer 4, an n type InGaAsP (current-restriction layer) 5 is formed. A p type current path region 6 is formed in the top surface of the current-restriction layer 5 and extends in to the second clad layer 4. On the layer 5, an electrode 7 made of an alloy of, for example, AuZn, is formed.

Figure 1B:
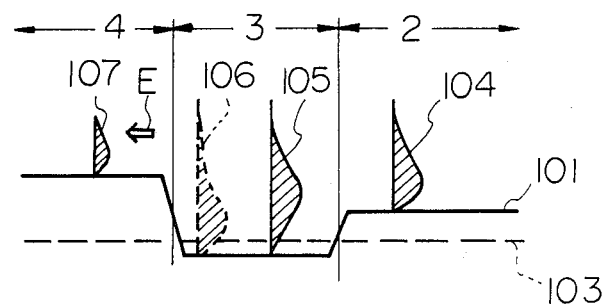
FIG. 1B depicts an energy band along the layers 2, 3, and 4 of FIG. 1A with a forward bias of the semiconductor laser.

FIG. 1B depicts an energy band along the layers 2, 3, and 4 of FIG. 1A under a forward bias of the semiconductor laser. In FIG. 1B, reference numeral 101 denotes a conduction band, 102 a valence band, and 103 the Fermi level with respect to the electrons. The energy bands at the first clad layer 2, the active layer 3, and the second clad layer 4 are schematically illustrated in FIG. 1B by reference numerals 2, 3, and 4. In FIG. 1B, the curved hatchings represent the distribution of electrons; that is, the ordinate (vertical direction) indicates the energy while the abscissa (horizontal direction) indicates the number of electrons.

In the conventional semiconductor laser, when electrons having a distribution curve 104 during their presence in the first clad layer 2 are injected into the active layer 3, since the energy relaxation time of the electrons in the InGaAsP active layer 3 is relatively long, the electrons having a high energy level, as shown by a distribution curve 105, cannot quickly be transformed into a thermal equilibrium state. The Auger process also prevents the electron distribution from going into thermal equilibrium, because electrons are excited to a higher energy state in the conduction band in this process. The distribution curve 106 corresponds to a thermal equilibrium state.

The electrons which have a high energy level and fail to be transformed into a thermal equilibrium state pass through the hetero-barrier and leak into the second clad layer 4 in the direction of the arrow E. If the ambient temperature around the semiconductor laser is relatively high, the top of the mountain defined by the distribution curve 105 is shifted upward. Accordingly, the higher the ambient temperature, the larger the amount of electrons which leak into the clad layer 4 in the direction of the arrow E, as shown by a distribution curve 107. Thus, the lasing threshold level varies, although it should be constant, with the variation of ambient temperature. That is, the lasing threshold level is largely dependent on the ambient temperature.

According to the present invention, the above-mentioned leak of electrons is suppressed in such a manner that the distribution curve of the electrons is reshaped so that it is almost identical to the curve 106, representing a thermal equilibrium state, before the electrons are injected into the active layer. Thereby, the dependency of the lasing threshold level on the ambient temperature can be minimized.

Figure 2A:
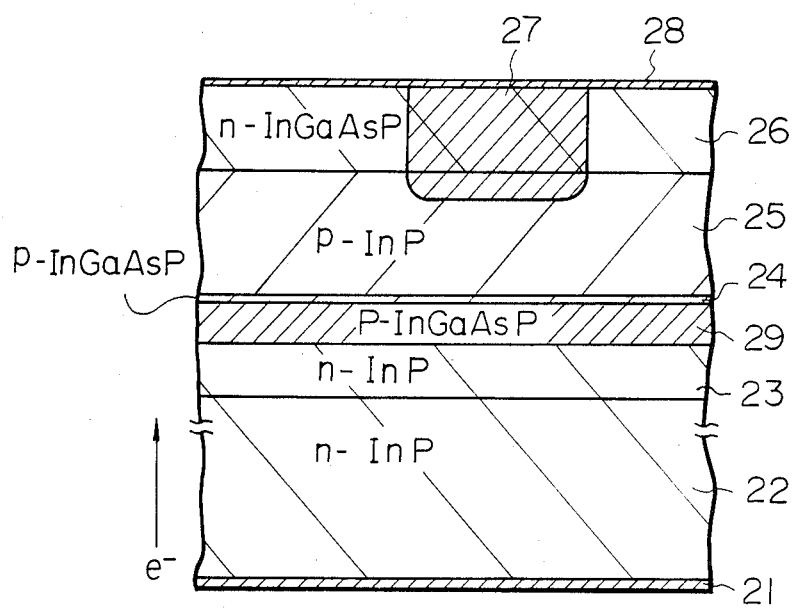
FIG. 2A is a cross-sectional view of a semiconductor laser according to a first embodiment of the present invention.

FIG. 2A is a cross-sectional view of a semiconductor laser according to a first embodiment of the present invention.

In FIG. 2A, reference numeral 21 denotes an electrode on the n side made of AuGeNi, 22 an n type InP substrate having a thickness of about 150 $\mu$m, 23 an n type InP clad layer having a thickness of 3 $\mu$m, 24 an active layer of p type InGaAsP ($In_{1-x}Ga_xAs_{1-y}P_y$, x=0.3, y=0.35) having a thickness of 0.1–0.2 $\mu$m, 25 a p type InP clad layer having a thickness of 1.5–2 $\mu$m, 26 an n type InGaAsP current-restriction layer having a thickness of 0.5 $\mu$m, 27 an current path region and 28 a p side electrode on the p side made of AuZn.

In FIG. 2A, member 29, which is newly introduced into the semiconductor laser, is a p type InGaAsP semiconductor layer ($In_{1-x}Ga_xAs_{1-y}P_y$, x=0.13, y=0.72) sandwiched between the first clad layer 24 of n type InP and the active layer 24 of P type InGaAsP. The band gap $BG_{29}$ of the semiconductor buffer layer 29 of the p type InGaAsP is wider than the band gap $BG_{24}$ of the active layer 24 but is narrower than the band gap $BG_{23}$ of the first clad layer 23, that is $BG_{24} < BG_{29} < BG_{23}$ (refer to FIG. 2C).

The wavelength $\lambda$, corresponding to each band gap, is, for example, $\lambda_{24} = 1.3$ $\mu$m for the $BG_{24}$, $\lambda_2 = 0.94$ $\mu$m for the $BG_{23}$, and $\lambda_{29} = 1.05$ $\mu$m for the $BG_{29}$.

It is very important to note that the wider the band gap, the shorter the previously mentioned energy relaxation time and the smaller the probability of the Auger process occurring. Accordingly, the energy relaxation time in the semiconductor buffer layer 29 is shorter than that of the active layer 24 and the probability of the Auger process occurring in buffer layer 29 is smaller than that in the active layer 24. This means that during their passage across the buffer layer 29, most of the electrons are quickly transformed into a state which is close to the thermal equilibrium state prior to being injected into the active layer 24.

Further, it should be noted that the buffer layer 29 is located at the upper edge of the flow region of electrons with respect to the active layer 24 (the flow of electrons is schematically shown by the arrow e⁻ in FIG. 2A). In addition, the conductivity type of the buffer layer 29 is opposite that of the clad layer 23, which is located at the upper edge of the flow region of electrons as seen from the buffer layer 29, Therefore, a p-n junction is formed between the clad layer 23 and the buffer layer 29.

Furthermore, since the electrons penetrate into the layer 29 by diffusion, the thickness of the buffer layer 29 must not exceed the diffusion length of the electrons injected into it. Accordingly, the thickness of the buffer layer 29 is determined to be, for example, 0.4 $\mu$m.

Figure 2B:
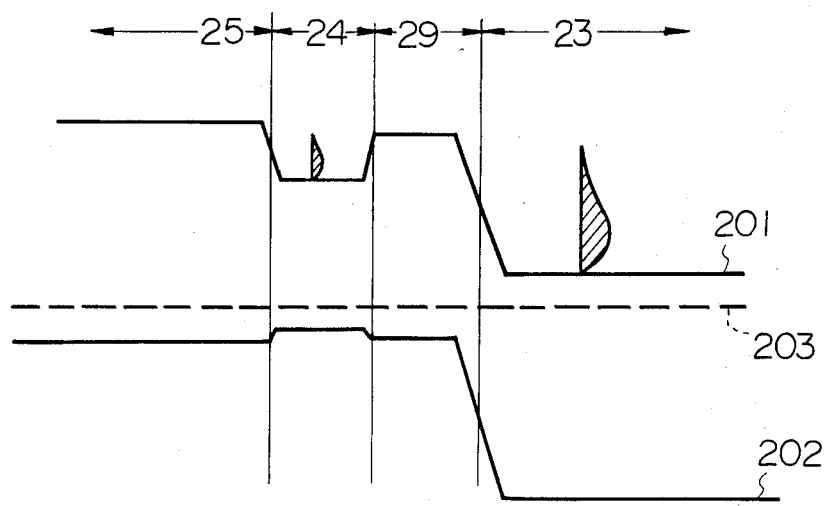
FIG. 2B depicts an energy band along the layers 23, 29, 24 and 25 of FIG. 2A with a non-forward bias of the semiconductor laser.
Figure 2C:
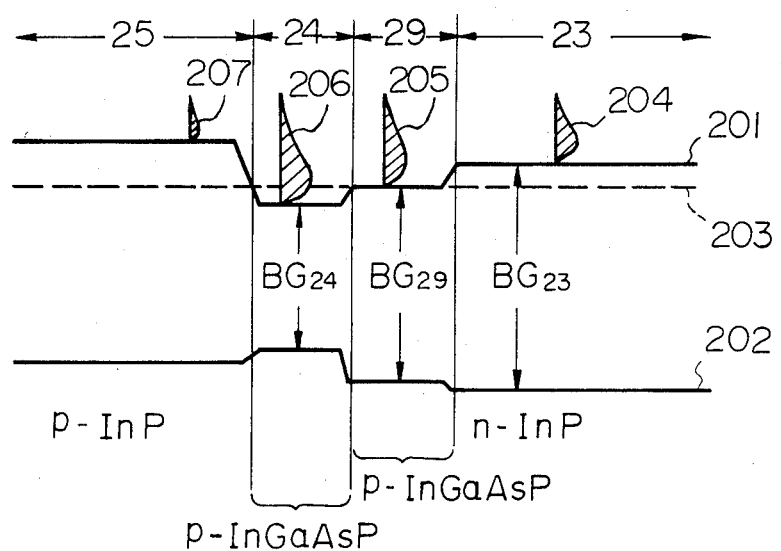
FIG. 2C depicts an energy band along the layers 23, 29, 24 and 25 of FIG. 2A with a forward bias of the semiconductor laser.

FIG. 2B depicts an energy band along the layers 23, 29, 24, and 25 shown in FIG. 2A with a non-forward bias of the semiconductor laser. FIG. 2C depcits an energy band along the layers 23, 29, 24, and 25 shown in FIG. 2A with a forward bias of the semiconductor laser. As is apparent from FIG. 2C, the energy level of the electrons, represented by a distribution curve 204, is lowered, as a whole, during the passage of the electrons across the buffer layer 29, with the result that a distribution curve 205 is obtained. Therefore, the energy level of the electrons is lowered in advance before the electrons are injected into the active layer 24 because, as previously explained, the $BG_{29}$ is wider than the $BG_{24}$. This means that the electrons are nearly in a state of thermal equilibrium prior to their injection into the active layer 24. Consequently, the amount of electrons which may leak from the active layer 24 into the second clad layer 25 is considerably reduced, as shown by the distribution curve 207. In FIG. 2B, 201 represents a conduction band and 202 represents a Fermi level.

In the above embodiment, the band gap of the buffer layer 29 is narrower than that of the second clad layer 25, as shown in FIG. 2C. Thus, the hetero-barrier against holes is reduced. However, it should be understood that a hole leakage due to such a reduction of the hetero-barrier against holes is very small. This is because of the fact that the effective mass of the holes is larger than that of the electrons.

Figure 3:
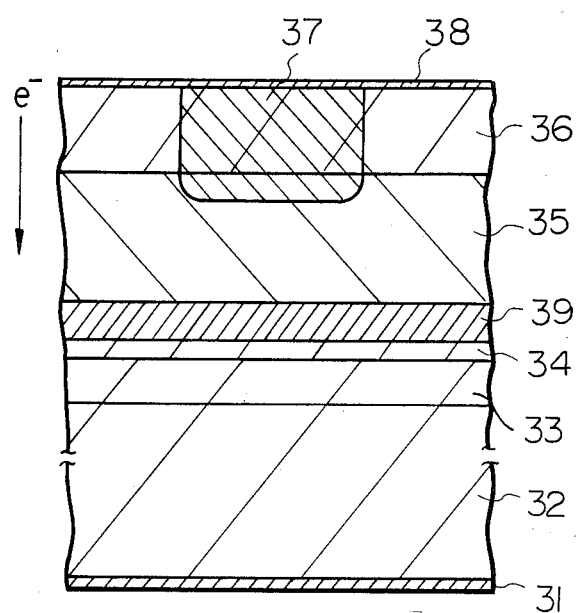
FIG. 3 is a cross-sectional view of a semiconductor laser according to a second embodiment of the present invention.

FIG. 3 is a cross-sectional view of a semiconductor laser according to a second embodiment of the present invention. In FIG. 3, reference numeral 31 denotes an electrode on the p side, 32 a p type InP substrate, 33 a p type InP clad layer, 34 a p type InGaAsP active layer, 35 an n type InP clad layer, 36 a p type InGaAsP current-restriction layer, 37 an n type current path region and 38 an n side electrode. Reference numeral 39 denotes a buffer layer of p type InGaAsP according to the present invention. The band gap $BG_{35}$ of the layer 35 must satisfy the equation $BG_{34} < BG_{39} < BG_{35}$. Further, the buffer layer 39 is located at the upper edge of the flow region of electrons as seen from the active layer 34 (the flow of electrons is schematically shown by the arrow e⁻ in FIG. 3). In addition, the conductivity type of the buffer layer 39 is opposite to that of the clad layer 35, which is located at the upper edge of the flow region of electrons seen from the buffer layer 39. Furthermore, since the electrons penetrate into the buffer layer 39 by diffusion, the thickness of the buffer layer 39 must not exceed the diffusion length of the electrons injected into it.

Figure 1B:
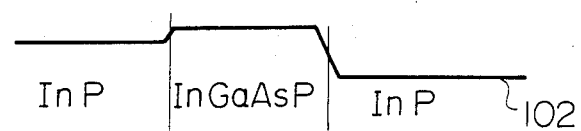

As can be understood from the above explanations, the important member of the present invention is the semiconductor buffer layer 39 (29) sandwiched between the active layer 34 (24) and the clad layer 33 (23). The inventors of the present invention found a structure similar to the layer 39 in Japanese Examined Patent Publication (Kokoku) No. 57(1982)-33875, claiming a convention priority of U.S. Ser. No. 418,572 and now matured as U.S. Pat. No. 3,838,359. The published invention also refers to a double hetero-structure laser. However, the published invention differs from the present invention regarding the following three points. First, the published invention refers to a GaAlAs-type semiconductor laser and not a InGaAsP/InP-type semiconductor laser of the present invention. Second, the buffer layer 21 of the present invention functions to improve the lasing threshold level-temperature characteristic, but in the published invention, the corresponding layer (referenced by 16 in FIG. 1 of the publication) functions as a lossy region so as to prevent a gain region (active layer) from being damaged due to the concentration of the optical field as compared to the gain region. In this regard, the published invention deals with a refractive index as $\delta_n$, this parameter has no relation to the present invention. Third, the conductivity type of the lossy region 16 is the same as that of the adjacent layer 14. However, in the present invention, the conductivity type of the lossy region is opposite that of the adjacent layer.

Figure 4:
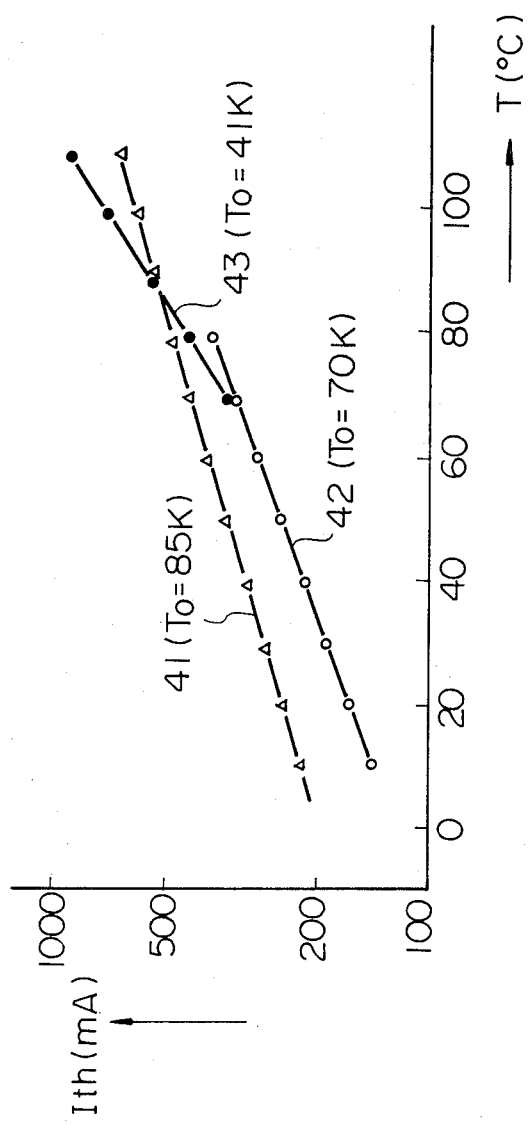
FIG. 4 is a graph showing experimental data concerning the lasing threshold level with respect to temperature.

FIG. 4 is a graph of experimental data concerning the lasing threshold level with respect to atmospheric temperature. The ordinate indicates the lasing threshold level as a threshold current $I_{th}$ in mA and the abscissa indicates the atmospheric temperature in °C. Generally, the expression $$I_{th} \propto I_0 exp\ (T/T_0)$$

is known, where $I_0$ denotes the constant, T the temperature, the $T_0$ a parameter measured in an absolute temperature (K) and characterizes a temperature characteristic of the semiconductor laser. Specifically, the larger the $T_0$ the smaller the dependency of the threshold current $I_{th}$ on the temperature. Therefore, it is desirable to realize a semiconductor laser having a high $T_0$. In the graph of FIG. 4, curve 41 indicates a characteristic of the semiconductor laser according to the present invention shown in FIG. 5. The value $T_0$ derived from the curve 41 is about 85K while the value $T_0$ derived from curves 42 and 43 is 70K and 41K, respectively. The curves are obtained by using conventional InGaAsP-/InP-type semiconductor lasers each having a structure similar to that shown in FIG. 5 but having no buffer layer 29 (39, 55).

Figure 5:
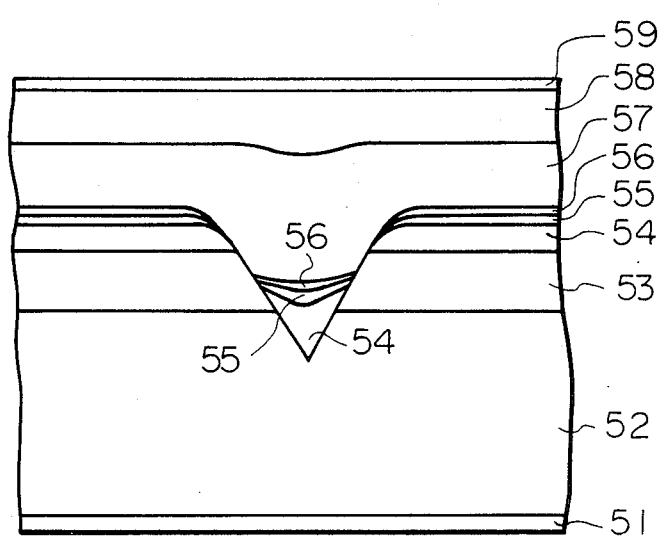
FIG. 5 is a cross-sectional view of an example of a laser to which the present invention is adapted.

FIG. 5 is a cross-sectional view of an example of the laser to which the present invention is adapted. The basic concept of employing the buffer layer 55 (29, 39) can be adapted to various types of known double hetero-structure lasers. The structure shown in FIG. 5 is merely one example among many. FIG. 5 shows a V-grooved substrate buried hetero-structure InGaAsP-/InP laser. Reference numeral 51 represents an n electrode. An n type InP substrate 52 is located thereon. A current-choking layer 53 of P type InP is formed thereon. Reference numeral 54 represents a n type InP clad layer. Reference numeral 56 represents an active layer of InGaAsP. The buffer layer 29 (39) (FIGS. 2A and 3) of the present invention is employed as a buffer layer 55 of p type InGaAsP. Reference numeral 57 represents a p type InP clad layer, 58 represents a p type InGaAs cap layer, and 59 represents a p electrode.

As previously mentioned, the energy relaxation of an electron is accelerated by the buffer layer of the present invention and thereby the electrons injected into the active layer are quickly transformed into a thermal equiblium state. Thus, the buffer layer is effective for improving the temperature characteristic. The buffer layer also contributes to an improvement in the following way.

With reference to FIG. 1B, excited electrons due to the Auger process leak into the clad layer 4 toward the clad layer 2. Accordingly, the Auger process contributes to worsening of the temperature characteristic. However, in the present invention, the Auger process is somewhat suppressed due to the presence of the buffer layer. That is, when some of the excited electrons, due to the Auger process, run into the buffer layer, the energy level of the excited electrons can easily be lowered because, as previously explained, the energy relaxation time defined in the buffer layer is shorter than that defined in the active layer.

As explained above in detail, the InGaAsP/InP-type laser according to the present invention provides a somewhat constant lasing threshold level regardless of variation in ambient temperature. It will be obvious that the present invention is not restricted to the above-mentioned embodiments and that many variations are possible for a person having ordinary skill in the art without departing from the scope of the present invention. For example, it is possible to add a buffer layer contributing to the achievement of thermal equilibrium on the lower edge of a flow region of electrons in addition to the upper edge of a flow region.

We claim:

1. A semiconductor light-emitting device fabricated as a double hetero-structure InGaAsP/InP-type laser comprising:
a semiconductor substrate;
an active layer having a band gap;
first and second clad layers each having a band gap; between which said active layer is sandwiched, said first clad layer of a first conductivity type and said second clad layer of a second conductivity type opposite to that of the first conductivity type having therein a region of electron flow with an upper edge and a diffusion length;
a buffer layer, comprising a semiconductor material, located at the upper edge of said region of electron flow, between said first clad layer and said active layer, said buffer layer being of the second conductivity type and having a band gap, said band gap of said buffer layer being wider than that of said active layer but narrower than said band gap of said first clad layer, said buffer layer having a thickness which does not exceed a diffusion length of the electrons.

2. A device as set forth in claim 1, wherein said active layer comprises p type InGaAsP, wherein said buffer layer comprises p type InGasP, wherein said first clad layer comprises n type InP, and wherein said second clad layer comprises p type InP.

3. A device as set forth in claim 1, further comprising a current-restriction layer, mounted on one of said first and second clad layers, said current restriction layer defining a current path region which extends into said corresponding clad layer.

4. A device as set forth in claim 1, wherein said semiconductor substrate has a V-shaped groove formed therein, and wherein said active layer, said buffer layer, and said first and second clad layers comprise a multilayer, formed in the V-shaped groove in said semiconductor substrate, in which said active layer and said buffer layer are sandwiched between said first and second clad layers.

5. A semiconductor light-emitting device, comprising:
a first electrode;

a substrate of a first conductivity type formed on said first electrode;

a first clad layer of the first conductivity type formed on the substrate and having a first band gap;

a semiconductor buffer layer of a second conductivity type formed on said first clad layer and having a second band gap narrower than the first band gap of said first clad layer;

an active layer of the second conductivity type formed on the semiconductor buffer layer having a third band gap narrower than the second band gap of said semiconductor buffer layer;

a second clad layer of the second conductivity type formed on said active layer;

a current restriction layer of the first conductivity type formed on said second clad layer;

a current path region of the second conductivity type formed in said current restriction layer; and a second electrode formed on said current restriction layer and said current path region.

6. A device as set forth in claim 5, wherein electrons having a diffusion length are injected into said semiconductor buffer layer and wherein said semiconductor buffer layer comprises a thickness less than or equal to the diffusion length of said electrons.

* * * * *

UNITED STATES PATENT AND TRADEMARK OFFICE
CERTIFICATE OF CORRECTION

PATENT NO.  : 4,546,479
DATED       : OCTOBER 8, 1985
INVENTOR(S) : HIROSHI ISHIKAWA ET AL.

It is certified that error appears in the above-identified patent and that said Letters Patent is hereby corrected as shown below:

FRONT PAGE [57] ABSTRACT, line 8, after "electrons" insert --as--:
line 9, delete ", the".

Col. 2, line 65, delete ",".

Col. 3, line 35, change "an" to --a p-type--; and change "a" to --an--;
line 36, delete "p side" (first occurrence).

Col. 5, line 28, change "the" (first occurrence) to --a--;
line 29, change "$T_o$ a" to --and $T_o$ the--.

Signed and Sealed this

Seventh Day of January 1986

[SEAL]

Attest:

DONALD J. QUIGG

Attesting Officer    Commissioner of Patents and Trademarks